(12) United States Patent
Zhou et al.

(10) Patent No.: US 11,871,632 B2
(45) Date of Patent: Jan. 9, 2024

(54) ARRAY SUBSTRATE AND MANUFACTURING METHOD THEREOF, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhenli Zhou, Beijing (CN); Zhiliang Jiang, Beijing (CN); Wei Liu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 510 days.

(21) Appl. No.: 16/915,301

(22) Filed: Jun. 29, 2020

(65) Prior Publication Data

US 2020/0411631 A1 Dec. 31, 2020

(30) Foreign Application Priority Data

Jun. 28, 2019 (CN) .......................... 201910577531.X

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
CPC ............ H01L 27/3279; H10K 59/1201; H10K 59/1315
See application file for complete search history.

(56) References Cited

U.S. PATENT DOCUMENTS

2015/0228927 A1\* 8/2015 Kim ...................... H10K 59/131
257/40
2017/0047385 A1\* 2/2017 Teng ................... H01L 27/3246
(Continued)

FOREIGN PATENT DOCUMENTS

| CN | 101221974 A | 7/2008 |
| CN | 103855190 A | 6/2014 |
| CN | 107068727 A | 8/2017 |

OTHER PUBLICATIONS

Office Action dated Jan. 15, 2021 issued in corresponding Chinese Application No. 201910577531.X.

*Primary Examiner* — Eric K Ashbahian
(74) *Attorney, Agent, or Firm* — Nath, Goldberg & Meyer; Joshua B. Goldberg

(57) ABSTRACT

The present disclosure provides an array substrate and a manufacturing method thereof, a display panel and a display device. The array substrate includes: a base substrate including a display area and a border area around the display area; and a signal line and an electrode line located in the border area of the base substrate. The signal line is arranged in a same layer as a source-drain electrode layer in the display area, and the electrode line is arranged in a same layer as an anode layer in the display area. The electrode line is overlapped on a surface of the signal line away from the base substrate, overlapping surfaces of the signal line and the electrode line are two concave-convex surfaces fitted to each other.

12 Claims, 4 Drawing Sheets

(56) References Cited

U.S. PATENT DOCUMENTS

2017/0323936 A1* 11/2017 Lee .................... H01L 27/3265
2018/0123060 A1*  5/2018 Jang .................... H01L 27/124
2019/0214587 A1*  7/2019 Kim .................... G09F 9/301

* cited by examiner

US 11,871,632 B2

ARRAY SUBSTRATE AND MANUFACTURING METHOD THEREOF, DISPLAY PANEL AND DISPLAY DEVICE

CROSS-REFERENCE TO RELATED APPLICATION

This application claims priority to Chinese Patent Application No. 201910577531.X, filed on Jun. 28, 2019, the contents of which are incorporated herein by reference in the entirety.

TECHNICAL FIELD

The present disclosure relates to the field of display technology, and more particularly, to an array substrate and a manufacturing method thereof, a display panel and a display device.

BACKGROUND

An Organic Light-Emitting diode (OLED) belongs to a display illumination technology which has been developed gradually in recent years, especially in the display industry. Because of its advantages of fast response, high contrast and flexibility, the OLED is considered to have a wide range of application prospects. In recent years, a border of an OLED display device is getting narrower and narrower.

SUMMARY

An embodiment of the present disclosure provides an array substrate, including: a base substrate including a display area and a border area around the display area and a signal line and an electrode line located in the border area of the base substrate. The signal line is arranged in a same layer as a source-drain electrode layer in the display area, and the electrode line is arranged in a same layer as an anode layer in the display area. The electrode line is overlapped on a surface of the signal line away from the base substrate, overlapping surfaces of the signal line and the electrode line are two concave-convex surfaces fitted to each other.

In some implementations, the signal line includes a first body parallel to the base substrate and a plurality of first recesses recessed from a surface of the first body away from the base substrate in a direction towards the base substrate; the electrode line includes a second body parallel to the base substrate and a plurality of first bumps protruding from a surface of the second body facing the signal line in a direction towards the signal line; the plurality of first recesses and the plurality of first bumps are arranged in one-to-one correspondence, and a surface of each of the first recesses and a surface of the bump corresponding to said each of the first recesses are completely fitted to each other to form concave-convex surfaces.

In some implementations, the plurality of first recesses protrude from a surface of the first body facing the base substrate in a direction towards the base substrate. The array substrate further includes: an interlayer dielectric layer located on the base substrate, the signal line and the electrode line are successively laminated on the interlayer dielectric layer, and a part of the interlayer dielectric layer in the border area has a plurality of grooves, and portions of the plurality of first recesses protruding from the first body and facing the surface of the base substrate are arranged in the plurality of grooves in one-to-one correspondence.

In some implementations, the plurality of first recesses are spaced along a line width direction of the signal line.

In some implementations, a cross-sectional shape of each of the first recesses on a plane parallel to the line width direction of the signal line and perpendicular to the base substrate includes an isosceles trapezoid.

In some implementations, a base angle of the isosceles trapezoid proximal to the base substrate is 135°.

In some implementations, the array substrate further includes a conductive layer located in the border area on the base substrate, the interlayer dielectric layer is located on the conductive layer, the plurality of grooves pass through the interlayer dielectric layer, and the plurality of first recesses electrically contact the conductive layer through the grooves respectively.

In some implementations, the array substrate further includes a gate line layer located in the display area on the base substrate and arranged in a same layer as the conductive layer.

In some implementations, the signal line includes a VSS signal line.

In some implementations, the electrode line includes an anode line.

An embodiment of the present disclosure further provides a manufacturing method of an array substrate, including: providing a base substrate including a display area and a border area around the display area; forming a film layer of an interlayer dielectric layer in the display area and the border area on the base substrate; patterning the film layer of the interlayer dielectric layer to form a plurality of grooves in a part of the interlayer dielectric layer within the border area; forming a film layer of a signal line in the border area on the base substrate, and the film layer of the signal line covers the patterned film layer of the interlayer dielectric layer; patterning the film layer of the signal line to form a pattern of the signal line; forming a film layer of an electrode line in the display area and the border area on the base substrate, and the film layer of the electrode line is overlapped on a surface of the pattern of the signal line away from the base substrate, so that overlapping surfaces of the pattern of the signal line and the film layer of the electrode line are two concave-convex surfaces which are fitted to each other; and patterning the film layer of the electrode line to form a pattern of the electrode line.

In some implementations, the patterned signal line includes a first body parallel to the base substrate and a plurality of first recesses recessed from a surface of the first body away from the base substrate in a direction towards the base substrate.

In some implementations, the manufacturing method further including: before forming the film layer of the interlayer dielectric layer, forming a conductive layer in the border area on the base substrate, the interlayer dielectric layer is formed on the conductive layer, and the plurality of the first recesses respectively pass through the plurality of grooves to electrically contact the conductive layer.

An embodiment of the present disclosure further provides a display panel, including the above array substrate.

An embodiment of the present disclosure further provides a display device, including the above display panel.

DETAILED DESCRIPTION

To make those skilled in the art better understand technical solutions of the present disclosure, an array substrate and a manufacturing method thereof, a display panel and a display device provided in the present disclosure will be further described in detail below in conjunction with the accompanying drawings and embodiments.

With the increasing popularity of display screens with a high screen-to-body ratio, in order to adapt to this trend, it is necessary to reduce a space for a border of the display screen so as to fabricate products with a narrow border. The design of products with the narrow border usually needs to reduce a width of a line in a gate driver on array (GOA) circuit, so as to reduce a space occupied by the circuit, however, a problem caused by which is that the brightness uniformity (i.e., LRU value) of the display screen is reduced, thus affecting the display quality.

Figure 1A:
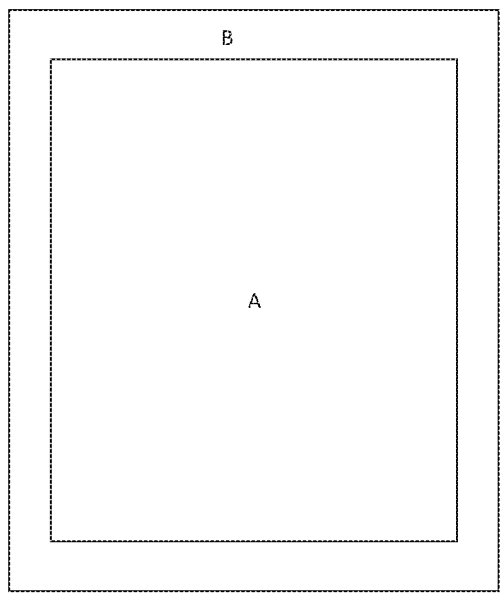
FIG. 1a is a top view of an array substrate provided in an embodiment of the present disclosure.
Figure 1B:
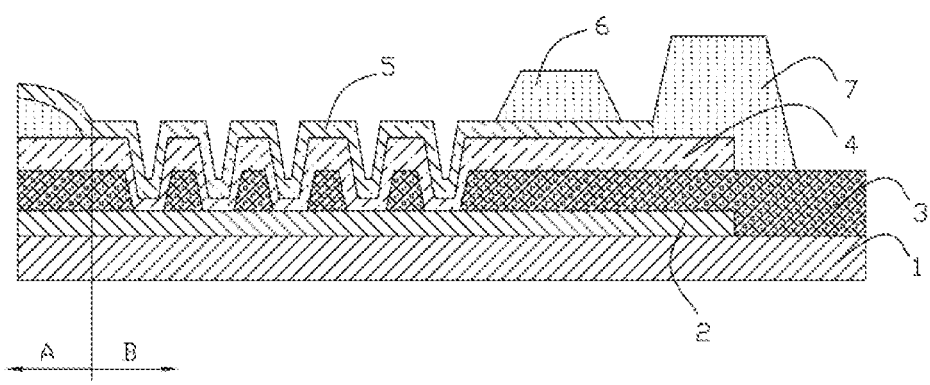
FIG. 1b is a partial sectional view of a signal line adopted in an embodiment of the present disclosure.

Referring to FIG. 1a and FIG. 1b together, an embodiment of the present disclosure provides an array substrate including a base substrate 1, which includes a display area A and a border area B around the display area A. FIG. 1b only shows a partial sectional view of the display area A. On the base substrate 1, a signal line 4 is arranged in the border area B, and an electrode line 5 is arranged in the display area A and the border area B. The electrode line 5 is overlapped on a surface of the signal line 4 away from the base substrate 1. In some implementations, the signal line 4 includes a VSS signal line, that is, a cathode signal line, and the electrode line 5 includes an anode line.

Moreover, overlapping surfaces (contact surfaces) of the signal line 4 and the electrode line 5 are concave-convex surfaces which are matched with each other, that is, the contact surfaces of the signal wire 4 and the electrode wire 5 are concave-convex surfaces, and the concave-convex surfaces of the signal wire 4 and the electrode wire 5 are in contact with each other and fit together. In this way, an overlapping area between the signal line 4 and the electrode line 5 can be increased, so that a contact resistance between the signal line 4 and the electrode line 5 and a VSS resistance can be reduced without changing the width of the line, and then the brightness uniformity of the display screen can be improved, thus the display quality can be improved.

Figure 2:
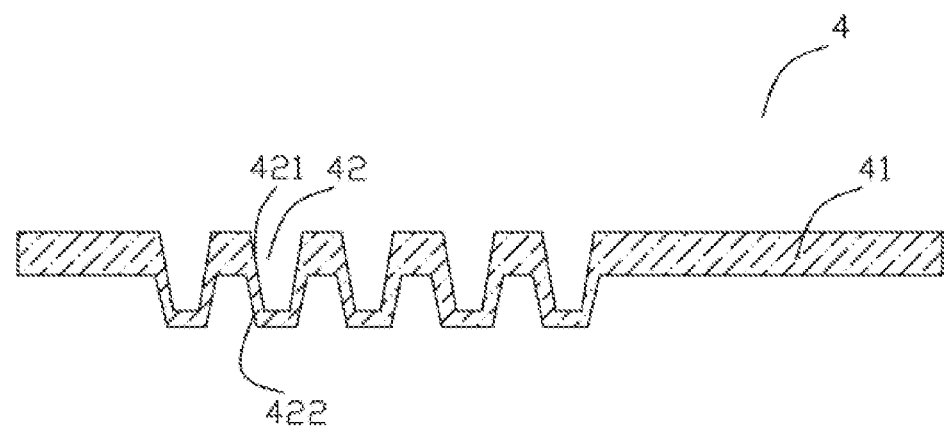
Figure 3:
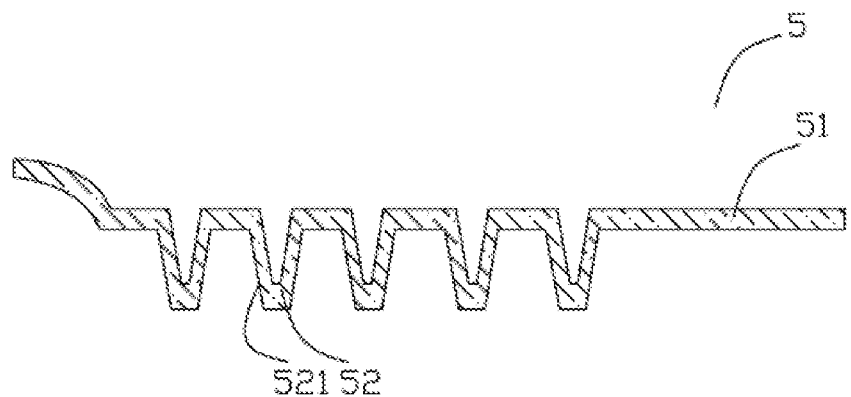
FIG. 3 is a partial sectional view of an electrode line adopted in an embodiment of the present disclosure.

In this embodiment, referring to FIG. 2, the signal line 4 includes a first body 41 parallel to the base substrate 1 and a plurality of first recesses 42 recessed from a surface of the first body 41 away from the base substrate 1 in a direction towards the base substrate 1 (a downward direction in FIG. 2). Referring to FIG. 3, the electrode line 5 includes a second body 51 parallel to the base substrate 1 and a plurality of first bumps 52 protruding from a surface of the second body 51 facing the signal line 4 in a direction towards the signal line 4 (a downward direction in FIG. 3). The plurality of first recesses 42 and the first bumps 52 are arranged in one-to-one correspondence, and a surface of each of the first bumps 42 and a surface of corresponding one of the first bumps 52, which are opposite to each other, fit perfectly to form concave-convex surfaces. Specifically, a concave surface 421 of each of the first recesses 42 and a convex surface 521 of the corresponding one of the first bumps 52 are completely fitted to form concave-convex surfaces.

In the present embodiment, as shown in FIG. 2, the first recess 42 protrudes from the surface of the first body 41 facing the base substrate 1, that is, the first recess 42 forms a protrusion 422 on a side of the first body 41 proximal to the base substrate 1.

Figure 4:
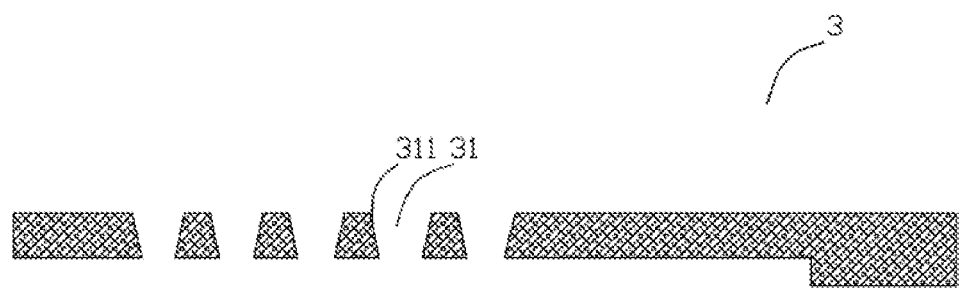
FIG. 4 is a partial sectional view of an interlayer dielectric layer adopted in an embodiment of the present disclosure.

Referring to FIG. 4, the base substrate 1 is also provided with an interlayer dielectric layer 3 thereon, the signal line 4 and the electrode line 5 are successively arranged on the interlayer dielectric layer 3, and a plurality of second recesses (grooves) 31 are formed in the border area B at a surface (i.e. an upper surface) of the interlayer dielectric layer 3 facing the signal line 4, the plurality of second recesses 31 and the plurality of first recesses 42 are arranged in one-to-one correspondence, and a concave surface 311 of each second recess 31 and a convex surface 422 of the first recess 42 corresponding to said second recess 31 are completely fitted to each other.

By providing the second recesses 31 in the interlayer dielectric layer 3, when manufacturing the signal line 4, as long as forming an entire film layer of the signal line 4 to cover a body of the interlayer dielectric layer 3 and recess surfaces 311 of the second recesses 31, the manufacturing of the first recesses 42 of the signal line 4 can be completed, thereby simplifying the manufacturing process.

In some implementations, the plurality of first recesses 42 are spaced along a line width direction of the signal line 4 (i.e., a left-right direction in the drawings), so that the overlapping area between the signal line 4 and the electrode line 5 in the line width direction of the signal line 4 can be maximized. Also, corresponding to the first recesses 42, the first bumps 52 are arranged in a same manner as the first recesses 42.

In some implementations, a section shape of each first recess 42 on a plane parallel to the line width direction of the signal line 4 and perpendicular to the base substrate 1 includes an isosceles trapezoid. In this way, side surfaces 421 of the first recess 42 are all slope surfaces, so that the length of the signal line 4 in the line width direction can be increased, and then the overlapping area between the signal line 4 and the electrode line 5 in the line width direction of the signal line 4 can be further increased. Certainly, in practical applications, the above section shape may also be a non isosceles trapezoid, a wave shape, a zigzag shape and so on.

Figure 5:
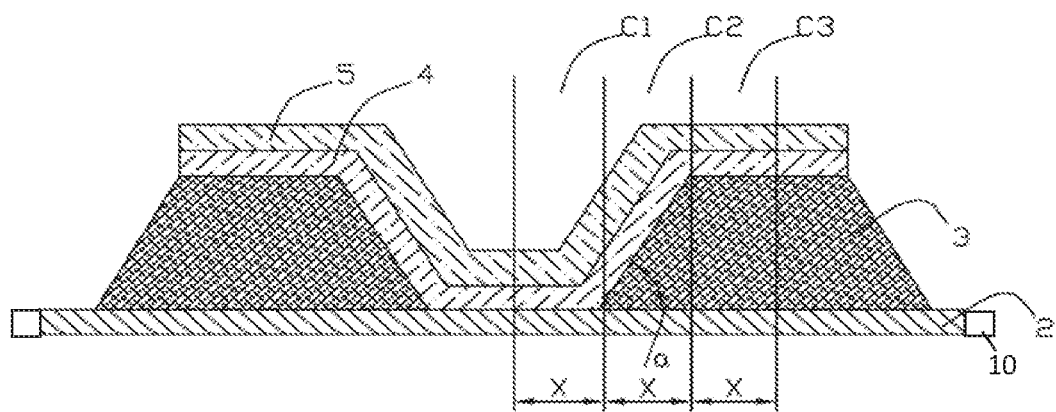
FIG. 5 is a partial enlarged view of an array substrate provided in an embodiment of the present disclosure.

In some implementations, a base angle of the isosceles trapezoid proximal to the base substrate is 135°, and a residual angle α of the base angle is 45°. As shown in FIG. 5, in the border area B, the signal line 4 can be divided into multiple groups of repeating units in the line width direction thereof. Each group of repeating units includes three different repeating structures (C1, C2, C3), which are shown from left to right in FIG. 5. For each group of repeating units, when the residual angle α of the base angle of the isosceles trapezoid proximal to the base substrate is 45°, a length of the signal line 4 in its line width direction is a sum of lengths of the three repeating structures (C1, C2, C3), namely:

$$X+X+\sqrt{2}X \approx 3.4X$$

Through experiments, it's found that, compared with the prior art, the overlapping area of the signal line 4 and the electrode line 5 is increased to 113%, and the contact resistance is reduced to 88.2%, thus effectively improving the brightness uniformity of the display screen.

In the present embodiment, a conductive layer 2 is further arranged in the border area B on the base substrate 1, the interlayer dielectric layer 3 covers the conductive layer 2, and each of the first recesses 42 electrically contacts the conductive layer 2 through corresponding one of the second recesses 31. That is to say, the second recesses 31 are equivalent to through holes, through which the first recesses 42 electrically contact the conductive layer 2.

The contact resistance of the signal line 4 can be further reduced by making the first recesses 42 electrically contact the conductive layer 2, that is, the signal line 4 is electrically coupled with the conductive layer 2. Similarly, the three different repeating structures (C1, C2, C3) of the signal line 4 shown in FIG. 5 are used for experiments, it is found that, under a condition that a block resistance of the signal line 4 is about 0.05Ω/□, and a block resistance of the conductive layer 2 is about 0.5Ω/□, the contact resistance between the signal line 4 and the electrode line 5 can be reduced to 91% and the VSS resistance can be reduced to 80.3% by electrically coupling the signal line 4 with the conductive layer 2. By contrast, the width of the signal line in the related art needs to be increased to 125% so as to reduce the contact resistance and the VSS resistance to a same extent as the present disclosure, thus the brightness uniformity of the display screen is further improved by making the first recess 42 electrically contact the conductive layer 2.

In some implementations, a gate line layer (as shown in FIG. 5) is arranged in the display area A on the base substrate 1, and the conductive layer 2 is arranged in a same layer as the gate line layer. The so-called "being arranged in a same layer" means that the conductive layer 2 and the gate line layer are made by a single deposition process and a single patterning process, so that the conductive layer 2 can be made without an additional process, thereby improving the processing efficiency.

Figure 6:
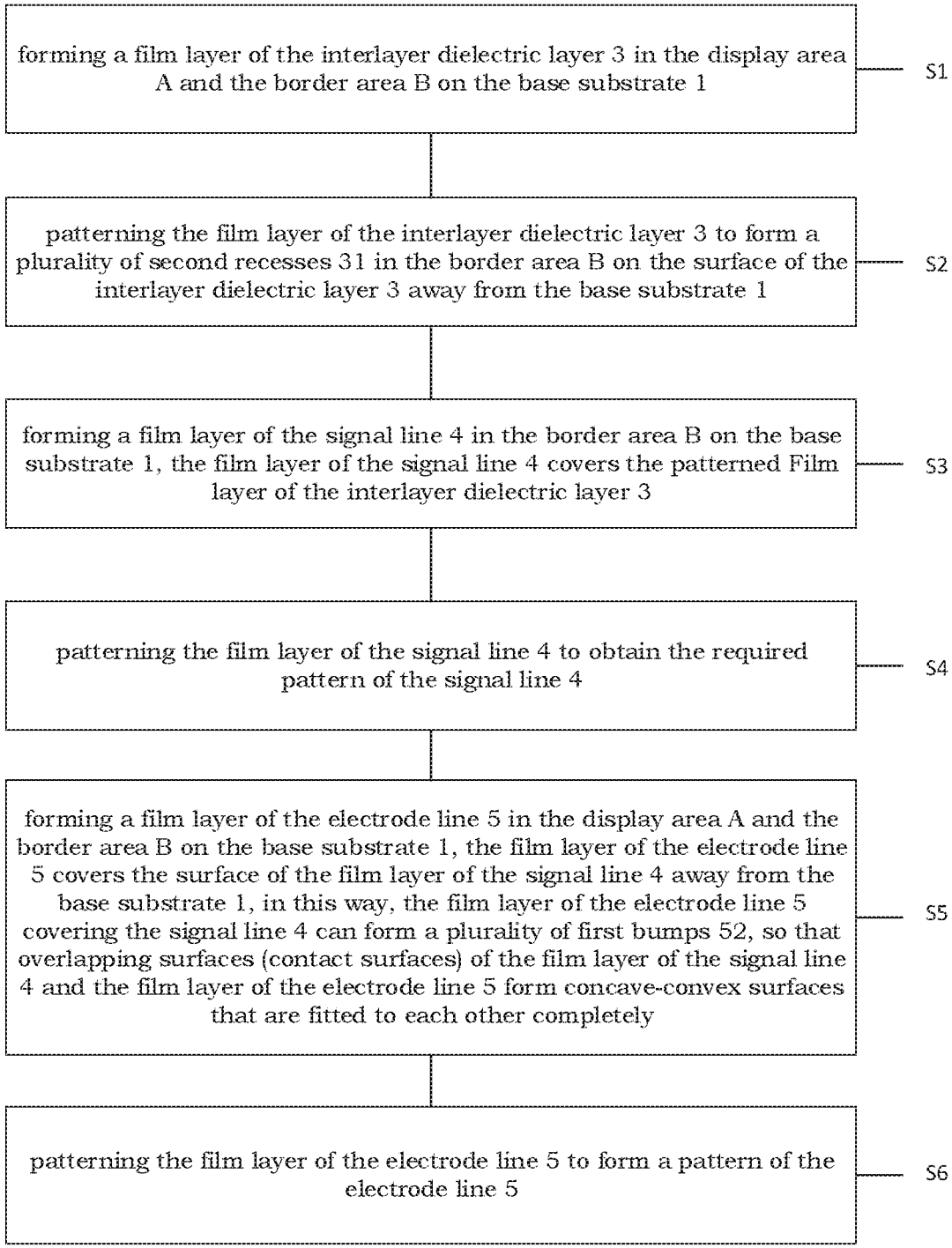
FIG. 6 is a flow chart of a manufacturing method of an array substrate according to an embodiment of the present disclosure.

As another technical solution, an embodiment of the present disclosure further provides a manufacturing method of the array substrate, taking the structure of the array substrate shown in FIG. 1 as an example, and as shown in FIG. 6, the manufacturing method includes steps S1 to S6.

At step S1, forming a film layer of the interlayer dielectric layer 3 in the display area A and the border area B on the base substrate 1.

At step S2, patterning the film layer of the interlayer dielectric layer 3 to form a plurality of second recesses 31 in the border area B on the surface of the interlayer dielectric layer 3 away from the base substrate 1.

At step S3, forming a film layer of the signal line 4 in the border area B on the base substrate 1, the film layer of the signal line 4 covers the patterned film layer of the interlayer dielectric layer 3.

Due to the existence of the plurality of second recesses 31 formed in the interlayer dielectric layer 3, a plurality of first recesses 42 can be formed by the film layer of the signal line 4 covering the patterned film layer of the interlayer dielectric layer 3.

At step S4, patterning the film layer of the signal line 4 to obtain the required pattern of the signal line 4.

At step S5, forming a film layer of the electrode line 5 in the display area A and the border area B on the base substrate 1, the film layer of the electrode line 5 covering the surface of the film layer of the signal line 4 away from the base substrate 1, in this way, the film layer of the electrode line 5 covering the signal line 4 can form a plurality of first bumps 52, so that overlapping surfaces (contact surfaces) of the film layer of the signal line 4 and the film layer of the electrode line 5 form concave-convex surfaces that are fitted to each other completely.

At step S6, patterning the film layer of the electrode line 5 to form a pattern of the electrode line 5.

By forming the overlapping surfaces of the signal line 4 and the electrode line 5 as two concave-convex surfaces that are fitted to each other, the overlapping area between the signal line 4 and the electrode line 5 can be increased, so that the contact resistance and the VSS resistance can be reduced without changing the line width, and then the brightness uniformity of display screen can be improved, thus the display quality can be improved.

An embodiment of the present disclosure further provides a display panel, which includes the array substrate provided by the embodiment of the present disclosure.

The display panel provided by the embodiment of the present disclosure can improve the brightness uniformity of the display screen and the display quality by adopting the array substrate provided by the embodiment of the present disclosure.

An embodiment of the present disclosure further provides a display device, which includes the above display panel provided by the embodiment of the present disclosure.

The display device provided by the embodiment of the disclosure can improve the brightness uniformity of the display screen and the display quality by adopting the display panel provided by the embodiment of the disclosure.

It is to be understood that the above description is only for the purpose of illustrating the principles of the present disclosure, but the present disclosure is not limited thereto. Various modifications and improvements can be made by those skilled in the art without departing from the spirit and the scope of the present disclosure, and such modifications and improvements are considered to be within the scope of the present disclosure.

What is claimed is:

1. An array substrate, comprising:
   a base substrate comprising a display area and a border area around the display area; and
   a signal line and an electrode line located in the border area of the base substrate, wherein
   the signal line is arranged in a same layer as a source-drain electrode layer in the display area, and the electrode line is arranged in a same layer as an anode layer in the display area; and
   the electrode line is overlapped on a surface of the signal line away from the base substrate, overlapping surfaces of the signal line and the electrode line are two concave-convex surfaces fitted to each other,
   wherein the signal line comprises a first body parallel to the base substrate and a plurality of first recesses recessed from a surface of the first body away from the base substrate in a direction towards the base substrate;
   the electrode line comprises a second body parallel to the base substrate and a plurality of first bumps protruding from a surface of the second body facing the signal line in a direction towards the signal line;
   the plurality of first recesses and the plurality of first bumps are arranged in one-to-one correspondence, and a surface of each of the first recesses and a surface of the bump corresponding to said each of the first recess are completely fitted to each other to form the concave-convex surfaces, and
   wherein the plurality of first recesses protrude from a surface of the first body facing the base substrate in a direction towards the base substrate;

the array substrate further comprises: an interlayer dielectric layer located on the base substrate, wherein the signal line and the electrode line are successively laminated on the interlayer dielectric layer, and a part of the interlayer dielectric layer in the border area has a plurality of grooves, and portions of the plurality of first recesses protruding from the first body and facing the surface of the base substrate are arranged in the plurality of grooves in one-to-one correspondence, wherein the array substrate further comprises: a conductive layer located in the border area on the base substrate, wherein the interlayer dielectric layer is located on the conductive layer, the plurality of grooves pass through the interlayer dielectric layer, and the plurality of first recesses electrically contact the conductive layer through the grooves respectively, a thickness of the first body of the signal line in a direction perpendicular to the base substrate is greater than a thickness of a part of the signal line located within the first recess; and a border, away from the display area, of an orthographic projection of the conductive layer on the base substrate coincides with a border, away from the display area, of an orthographic projection of the signal line on the base substrate.

2. The array substrate of claim 1, wherein the plurality of first recesses are spaced along a line width direction of the signal line.

3. The array substrate of claim 2, wherein a cross-sectional shape of each of the first recesses on a plane parallel to the line width direction of the signal line and perpendicular to the base substrate comprises an isosceles trapezoid.

4. The array substrate of claim 3, wherein a base angle of the isosceles trapezoid proximal to the base substrate is 135°.

5. The array substrate of claim 1, further comprising:
a gate line layer located in the display area on the base substrate and arranged in a same layer as the conductive layer.

6. The array substrate of claim 1, wherein the signal line comprises a VSS signal line.

7. The array substrate of claim 1, wherein the electrode line comprises an anode line.

8. A display panel, comprising the array substrate of claim 1.

9. A manufacturing method of an array substrate, comprising:
providing a base substrate comprising a display area and a border area around the display area;
forming a film layer of an interlayer dielectric layer in the display area and the border area on the base substrate;
patterning the film layer of the interlayer dielectric layer to form a plurality of grooves in a part of the interlayer dielectric layer within the border area;
forming a film layer of a signal line in the border area on the base substrate, and the film layer of the signal line covers the patterned film layer of the interlayer dielectric layer;
patterning the film layer of the signal line to form a pattern of the signal line;
forming a film layer of an electrode line in the display area and the border area on the base substrate, and the film layer of the electrode line is overlapped on a surface of the pattern of the signal line away from the base substrate, so that overlapping surfaces of the pattern of the signal line and the film layer of the electrode line are two concave-convex surfaces which are fitted to each other; and
patterning the film layer of the electrode line to form a pattern of the electrode line,
wherein the pattern of the signal line comprises a first body parallel to the base substrate and a plurality of first recesses recessed from a surface of the first body away from the base substrate in a direction towards the base substrate, the manufacturing method further comprises:
before forming the film layer of the interlayer dielectric layer, forming a conductive layer in the border area on the base substrate, wherein,
the interlayer dielectric layer is formed on the conductive layer, and the plurality of the first recesses respectively pass through the plurality of grooves to electrically contact the conductive layer, and wherein a thickness of the first body of the signal line in a direction perpendicular to the base substrate is greater than a thickness of a part of the signal line located within the first recess; and a border, away from the display area, of an orthographic projection of the conductive layer on the base substrate coincides with a border, away from the display area, of an orthographic projection of the signal line on the base substrate.

10. The manufacturing method of claim 9, wherein a cross-sectional shape of each of the first recesses on a plane parallel to the line width direction of the signal line and perpendicular to the base substrate comprises an isosceles trapezoid.

11. The manufacturing method of claim 10, wherein a base angle of the isosceles trapezoid proximal to the base substrate is 135°.

12. A display device, comprising the display panel of claim 8.

* * * * *